US012745610B2

(12) United States Patent
Fang et al.

(10) Patent No.: US 12,745,610 B2
(45) Date of Patent: Sep. 22, 2026

(54) IMPLANT HARD MASK FOR SUBSTRATES

(71) Applicant: Applied Materials, Inc., Santa Clara, CA (US)

(72) Inventors: Jun Fang, Xi'an (CN); Ludovico Megalini, Santa Clara, CA (US); Yi Zheng, Sunnyvale, CA (US); Jang Seok Oh, Santa Clara, CA (US); Feng Shou Wang, Xi'an city (CN)

(73) Assignee: APPLIED MATERALS, INC.

( * ) Notice: Subject to any disclaimer, the term of this patent is extended or adjusted under 35 U.S.C. 154(b) by 206 days.

(21) Appl. No.: 18/398,564

(22) Filed: Dec. 28, 2023

(65) Prior Publication Data

US 2025/0062122 A1 Feb. 20, 2025

(30) Foreign Application Priority Data

Aug. 14, 2023 (WO) ................ PCT/CN2023/112880

(51) Int. Cl.

| | |
|---|---|
| ***H10P 76/20*** | (2026.01) |
| ***H10P 14/20*** | (2026.01) |
| ***H10P 14/60*** | (2026.01) |

(52) U.S. Cl.
CPC ........ *H10P 76/204* (2026.01); *H10P 14/2904* (2026.01); *H10P 14/6336* (2026.01)

(58) Field of Classification Search
CPC ........... H01L 21/0273; H01L 21/02274; H01L 21/02378; H01L 21/0332
USPC ................................................ 438/689–724
See application file for complete search history.

(56) References Cited

U.S. PATENT DOCUMENTS

2015/0118832 A1 4/2015 Wood et al.
2023/0197465 A1* 6/2023 Marchegiani ........... H01L 21/32 438/714

FOREIGN PATENT DOCUMENTS

CN 110323181 A * 10/2019 ....... H01L 21/76825

* cited by examiner

*Primary Examiner* — Duy Vu N Deo
(74) *Attorney, Agent, or Firm* — Moser Taboada

(57) ABSTRACT

A method for forming an implant hard mask on a substrate provides a multi-layer hardmask resistant to high processing temperatures and ion energies. In some embodiments, the method may comprise depositing a screen layer of oxide material with a thickness of approximately 20 nm to approximately 100 nm, depositing a first layer of the implant hard mask of amorphous carbon with a second thickness of approximately 100 nm to approximately 3000 nm; depositing a second layer of the implant hard mask of oxide with a third thickness of approximately 100 nm to approximately 3000 nm; depositing a photoresist layer on the second layer of the implant hard mask, and patterning the photoresist layer to expose portions of the second layer of the implant hard mask, etching the second layer of the implant hard mask and then the first layer of the implant hard mask using a hard mask etch process to expose portions of the screen layer.

19 Claims, 6 Drawing Sheets

IMPLANT HARD MASK FOR SUBSTRATES

CROSS-REFERENCE TO RELATED APPLICATIONS

This application claims the benefit of Patent Cooperation Treaty Application PCT/CN2023/112880, filed on 14 Aug. 2023, which is herein incorporated by reference in its entirety.

FIELD

Embodiments of the present principles generally relate to semiconductor processing of semiconductor substrates.

BACKGROUND

With the advancement of the use of silicon carbide materials for power devices, traditional processes for silicon substrates are proving to be unsuccessful when used on the harder silicon carbide material. For example, dopant diffusion within silicon carbide is negligible at best. While ion implantation may provide a solution for silicon carbide materials, ion implantation of silicon carbide requires high ion energy and high temperatures unlike implantation of silicon. Traditional photoresist materials are not compatible with the high implantation temperatures. The industry has moved towards the use of oxide hard masks for silicon carbide. However, the inventors have observed that the use of oxide as a hot implant hard mask have several shortcomings that make oxide material a poor choice as a silicon carbide hard mask.

Accordingly, the inventors have provided methods for forming implant hard masks on substrates with high temperature and high ion energy blocking capabilities.

SUMMARY

Methods for forming implant hard masks on substrates are provided herein.

In some embodiments, a method for forming an implant hard mask on a substrate may comprise depositing a first layer of the implant hard mask on a screen layer on the substrate and depositing a second layer of the implant hard mask on the first layer of the implant hard mask where a first material of the first layer of the implant hard mask is different from a second material of the second layer of the implant hard mask and where only one of the first material or the second material is amorphous carbon (a-C).

In some embodiments, the method may further include a substrate that is silicon carbide (SiC), a screen layer that is an a-C layer with a first thickness of approximately 20 nm to approximately 100 nm where the first layer of the implant hard mask is an oxide layer with a second thickness of approximately 100 nm to approximately 3000 nm and where the second layer of the implant hard mask is an a-C layer with a third thickness of approximately 100 nm to approximately 3000 nm, a second layer that is deposited using a plasma-enhanced chemical vapor deposition (PECVD) process, depositing an etch stop layer on the second layer of the implant hard mask and/or depositing a photoresist layer on the etch stop layer, an etch stop layer that is a silicon dioxide layer, silicon oxynitride layer, or a dielectric anti-reflective coating (DARC) layer.

In some embodiments, the method may further include patterning the photoresist layer to expose portions of the etch stop layer, etching the etch stop layer to expose portions of the second layer of the implant hard mask, and etching the second layer of the implant hard mask and then the first layer of the implant hard mask using a hard mask etch process to expose portions of the screen layer, an implant hard mask that withstands processing temperatures of greater than approximately 500 degrees Celsius, an implant hard mask that protects the substrate from damage during hot implanting processes performed with an energy level of approximately 500 KeV or greater, a hard mask etch process that uses a first chemistry during etching of the second layer of the implant hard mask and a second chemistry different from the first chemistry during etching of the first layer of the implant hard mask, a substrate that is silicon carbide (SiC) where the screen layer is an oxide layer with a first thickness of approximately 20 nm to approximately 100 nm, where the first layer of the implant hard mask is an a-C layer with a second thickness of approximately 100 nm to approximately 3000 nm, and where the second layer of the implant hard mask is an oxide layer with a third thickness of approximately 100 nm to approximately 3000 nm, and/or a first layer that is deposited using a plasma-enhanced chemical vapor deposition (PECVD) process.

In some embodiments, the method may further include depositing a photoresist layer on the second layer of the implant hard mask, patterning the photoresist layer to expose portions of the second layer of the implant hard mask and etching the second layer of the implant hard mask and then the first layer of the implant hard mask using a hard mask etch process to expose portions of the screen layer, a hard mask etch process that uses a first chemistry during etching of the second layer of the implant hard mask and a second chemistry different from the first chemistry during etching of the first layer of the implant hard mask, an implant hard mask that withstands processing temperatures of greater than approximately 500 degrees Celsius, and/or an implant hard mask that protects the substrate from damage during hot implanting processes performed with an energy level of approximately 500 KeV or greater.

In some embodiments, a method for forming an implant hard mask on a substrate may comprise depositing a screen layer on the substrate where the screen layer is an oxide layer with a first thickness of approximately 20 nm to approximately 100 nm, depositing a first layer of the implant hard mask on the screen layer where the first layer is an a-C layer with a second thickness of approximately 100 nm to approximately 3000 nm, depositing a second layer of the implant hard mask on the first layer of the implant hard mask where the second layer of the implant hard mask is an oxide layer with a third thickness of approximately 100 nm to approximately 3000 nm, depositing a photoresist layer on the second layer of the implant hard mask, patterning the photoresist layer to expose portions of the second layer of the implant hard mask, and etching the second layer of the implant hard mask and then the first layer of the implant hard mask using a hard mask etch process to expose portions of the screen layer where a vertical etch profile of the hard mask etch process has sidewalls within +/−5 degrees of vertical relative to a horizontal surface of the substrate.

In some embodiments, the method may further include a hard mask etch process that uses a first chemistry during etching of the second layer of the implant hard mask and a second chemistry different from the first chemistry during etching of the first layer of the implant hard mask.

In some embodiments, a non-transitory, computer readable medium having instructions stored thereon that, when executed, cause a method for forming an implant hard mask on a SiC substrate to be performed, the method may comprise depositing a first layer of the implant hard mask on a screen layer on the SiC substrate where the first layer is an a-C layer with a second thickness of approximately 100 nm to approximately 3000 nm, depositing a second layer of the implant hard mask on the first layer of the implant hard mask where the second layer of the implant hard mask is an oxide layer with a third thickness of approximately 100 nm to approximately 3000 nm, depositing a photoresist layer on the second layer of the implant hard mask, patterning the photoresist layer to expose portions of the second layer of the implant hard mask, and etching the second layer of the implant hard mask and then the first layer of the implant hard mask using a hard mask etch process to expose portions of the screen layer where a vertical etch profile of the hard mask etch process has sidewalls within +/−5 degrees of vertical relative to a horizontal surface of the SiC substrate.

In some embodiments, the method of the non-transitory, computer readable medium may further include using a first chemistry during etching of the second layer of the implant hard mask and a second chemistry different from the first chemistry during etching of the first layer of the implant hard mask.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
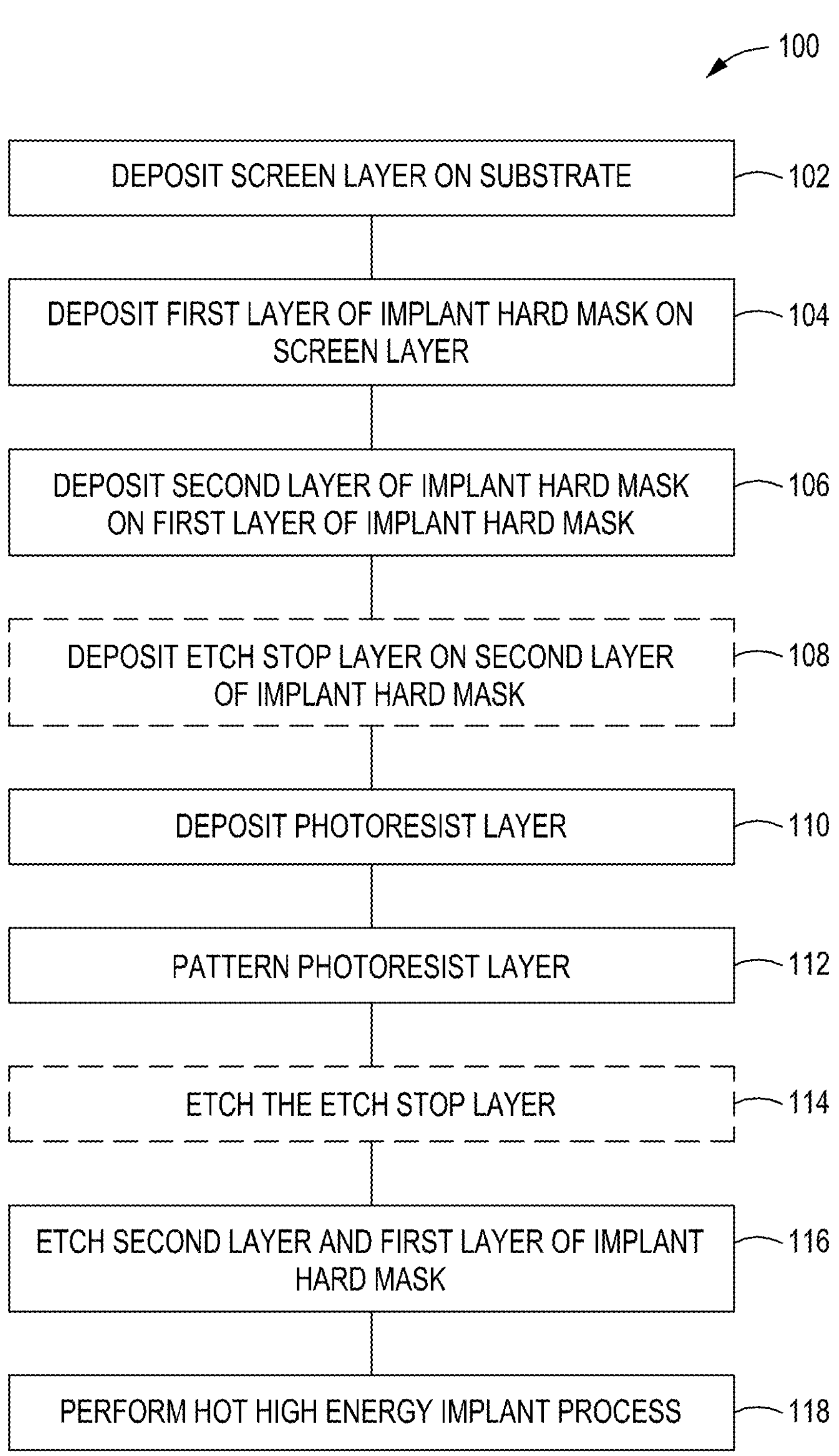
FIG. 1 is a method of forming an implant hard mask on a substrate in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods provide implant hard masks for substrates that can withstand the high temperatures and high energies associated with ion implantation in, for example, silicon carbide (SiC) material and the like. The implant hard mask incorporates layers of different materials that can be easily deposited and patterned in a compact and low-cost process flow. In some embodiments, a layer of amorphous carbon (a-C) and a layer of oxide are combined to form an implant hard mask capable of withstanding ion energies in excess of 500 KeV and temperatures of 500 degrees Celsius and beyond. The use of a-C material and oxide material allows for an oxide etch selectivity of greater than 30:1 in some embodiments to enhance patterning and ion implantation quality on the substrate. The a-C material is also ashable which allows the material to be more easily removed over wet etching of oxide material that has been subjected to high ion energies. The a-C layer of the implant hard mask provides enhanced ion blocking capabilities for high energy ion implantation and vertical etch profiles.

In substrate examples formed of SiC, the high energy implant process causes SiC crystal structure damage which is mitigated by a hot implant process (>500 degrees Celsius) for crystal lattice recovery. However, the photoresist used for substrate patterning is not able to withstand such high temperatures. Thus, a hard mask is required for patterning of the SiC substrate. The industry has begun using plasma enhanced chemical vapor deposition (PECVD) oxide as a hot implant hard mask layer. However, with oxide as a hot implant hard mask, the inventors have found that the oxide does not have a high etch selectivity over the screen layer material that protects the SiC, the oxide hard mask layer after a hot implant process is difficult to remove by wet etching, and the thickness of the oxide needs to be greater than 2 μm thick to block the hot implant dose for typical SiC planar MOS devices. In addition, an even thicker oxide layer is needed for SiC trench MOS hot implant processes. With thick oxide layers, the lithography and etch processes become problematic due to the poor vertical etch profiles in thick oxide.

For typical SiC device hot implant hard masks, conventional processes use oxide as a hard mask and nitride as a screen layer to protect the SiC substrate surface during processing. However, oxide etch selectivity to nitride is usually less than 8:1, causing approximately 50 nm to approximately 100 nm of the nitride material to be etched off during the oxide etch process when patterning the hard mask. Another issue as mentioned above is that processes to form a thicker oxide layer (needed to block higher energy hot implant doses) creates a challenge to get vertical etch profiles in the oxide and to remove the oxide after exposure to implant processes. The issues with oxide and nitride make the combination of materials a very poor performing solution for hard masks for SiC substrate patterning.

The methods of the present principles leverage a multi-layer hard mask with an a-C layer to substantially enhance the hard mask performance for high temperature and/or high ion energy processes. The a-C is used in conjunction with oxide material in a hot, high-energy implant hard mask. The a-C has better high energy implant blocking capabilities and can achieve vertical etch profiles. By using layers of oxide and a-C, the oxide etch selectivity is greater than 30:1 over a-C in some embodiments which dramatically reduces any thinning of the screen layer on the SiC substrate. The a-C material is opaque and may obscure alignment marks if too thick. Oxide is transparent and the combination of oxide and a-C of the present hard mask allows alignment marks and the like to be identified during photoresist processing. If the hard mask layer was solely composed of a-C material, the thickness could make the hard mask completely opaque and block the alignment marks or make the marks very hard to discern.

In some embodiments, an a-C layer+oxide/a-C stack layer may be used to serve as a screen layer and a SiC hot, high-energy implant hard mask. The a-C layer of the implant hard mask may be deposited using a PECVD process to enhance the properties of the a-C. The PECVD process allows thicker a-C layer to be deposited and has excellent particle performance (low particle generation). The gas chemistry used in the PECVD process may be, but is not limited to, $C_xH_y$ (e.g., $C_3H_6$, $C_2H_2$, etc.) and the like. The thickness of the screen layer of a-C may be from approximately 20 nm to approximately 100 nm in thickness. The screen layer functions as an etch stop layer and also functions to protect the surface of the SiC substrate from damage during hot, high-energy implant processes. The thickness of the first hard mask layer of oxide may be from approximately 100 nm to approximately 3000 nm. The thickness of the second hard mask layer of a-C may be from approximately 100 nm to approximately 3000 nm. The first hard mask layer of oxide and the second hard mask layer of a-C form an implant hard mask with a thickness less than a thickness required for a hard mask layer formed only from oxide.

The thinner hard mask allows for better etching profile control and makes vertical profiles easier to obtain. An etch mask layer of $SiO_2$ or SiON, for example but not limited to, may be deposited on the second hard mask layer as a dry etch stop for etching a subsequently deposited photoresist layer. The photoresist layer may be carbon-based and have similar etching characteristics as a-C. The etch stop layer allows the photoresist to be patterned without removing the a-C material of the second hard mask layer. Because the screen layer is formed of a-C, the first hard mask layer of oxide can then be etched without substantial damage/removal of the screen layer as found in traditional processes which use a nitride layer. The etch selectivity of oxide over a-C is greater than 15:1, preserving the a-C screen layer during the oxide etching process. The a-C has better ion blocking properties than oxide and the a-C and oxide stack layer has better etch vertical profile capabilities compared to a hard mask layer of thick oxide only.

In some embodiments, an oxide layer+a-C/oxide stack layer may be used to serve as a screen layer and a SiC hot, high-energy implant hard mask. The a-C layer of the implant hard mask may be deposited using a PECVD process to enhance the properties of the a-C. The PECVD process allows thicker a-C to be deposited and has excellent particle performance (low particle generation). The gas chemistry used in the PECVD process may be, but is not limited to, $C_xH_y$ (e.g., $C_3H_6$, $C_2H_2$, etc.) and the like. The thickness of the screen layer of oxide may be from approximately 20 nm to approximately 100 nm in thickness. The screen layer functions as an etch stop layer and also functions to protect the surface of the SiC substrate from damage during hot high energy implant processes. The thickness of the first hard mask layer of a-C may be from approximately 100 nm to approximately 3000 nm. The thickness of the second hard mask layer of oxide may be from approximately 100 nm to approximately 3000 nm. The first hard mask layer of a-C and the second hard mask layer of oxide form an implant hard mask with a thickness less than a thickness required for a hard mask layer formed only from oxide. The thinner hard mask allows for better etching profile control and makes vertical profiles easier to obtain. The photoresist layer may be deposited directly on the second hard mask layer of oxide. The etch selectivity of a-C over oxide is greater than 30:1. Because the screen layer is formed of oxide, the first hard mask layer of a-C can then be etched without substantial damage/removal of the screen layer. The a-C has better ion blocking properties than oxide and the a-C and oxide stack layer has better etch vertical profile capabilities compared to a hard mask layer of thick oxide only.

Figure 2:
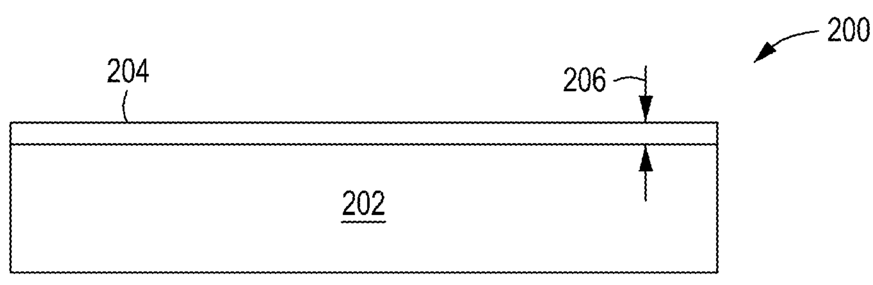
FIG. 2 depicts a cross-sectional view of a screen layer deposited on a substrate in accordance with some embodiments of the present principles.

The method 100 of FIG. 1 may be adapted based on the order of the material layers of the hard mask. As used herein, 'selectivity' refers to etch rate selectivity of an etching process of one material over another. For example, an etch rate selectivity of 2:1 of material A over material B means that material A etches at twice the rate of material B during an etch process. A higher selectivity can be used to ensure that an etch process does not undesirably etch adjacent material during the etch process. In block 102, a screen layer 204 is deposited on a substrate 202 as depicted in a view 200 of FIG. 2. In some embodiments, the substrate materials may include, but are not limited to, SiC materials and the like. The screen layer 204 has multiple functions and may be composed of different materials based on the hard mask composition. The screen layer 204 helps to protect the SiC material of the substrate and to avoid a tunneling effect in the SiC during implantation while also serving as an etch stop layer during patterning of the hard mask. In some embodiments, the screen layer 204 may have a thickness 206 of approximately 20 nm to approximately 100 nm. In some embodiments, the screen layer 204 may be composed of an a-C material or an oxide material and the like. The material of the screen layer 204 is selected based on the material's selectivity between a first layer of the implant hard mask and the screen layer 204 so that the screen layer 204 provides an optimal etch stop layer as the first layer of the implant hard mask is etched.

Figure 3:
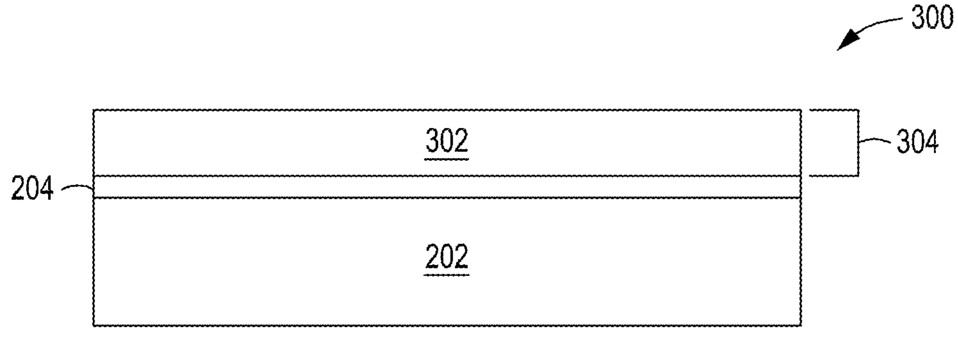
FIG. 3 depicts a cross-sectional view of a first layer of an implant hard mask deposited on a substrate in accordance with some embodiments of the present principles.
Figure 4:
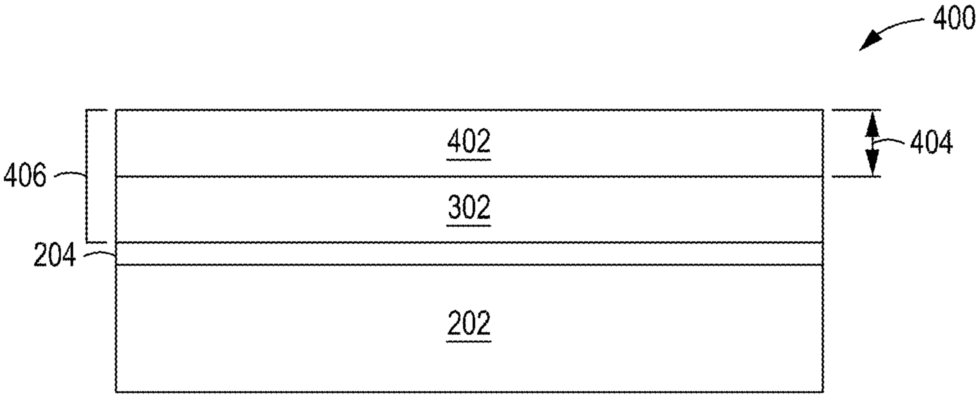
FIG. 4 depicts a cross-sectional view of a second layer of an implant hard mask deposited on a substrate in accordance with some embodiments of the present principles.

In block 104, the first layer 302 of the implant hard mask is deposited on the screen layer 204 as depicted in a view 300 of FIG. 3. In some embodiments, the first layer 302 has a thickness 304 of approximately 100 nm to approximately 3000 nm. In some embodiments, the first layer 302 may be composed of an a-C material or an oxide material and the like. The selection of the material for the first layer 302 may be based on the selection of the material for the screen layer 204 and a subsequent material used for a second layer of the implant hard mask. In block 106, a second layer of the implant hard mask 406 may be deposited on the first layer 302 of the implant hard mask 406 as depicted in a view 400 of FIG. 4. In some embodiments, the second layer 402 has a thickness 404 of approximately 100 nm to approximately 3000 nm. In some embodiments, the second layer 402 may be composed of an a-C material or an oxide material and the like. Each layer of the implant hard mask 406 is composed of different materials, with one of the first layer 302 or the second layer 402 being a-C material.

Figure 5:
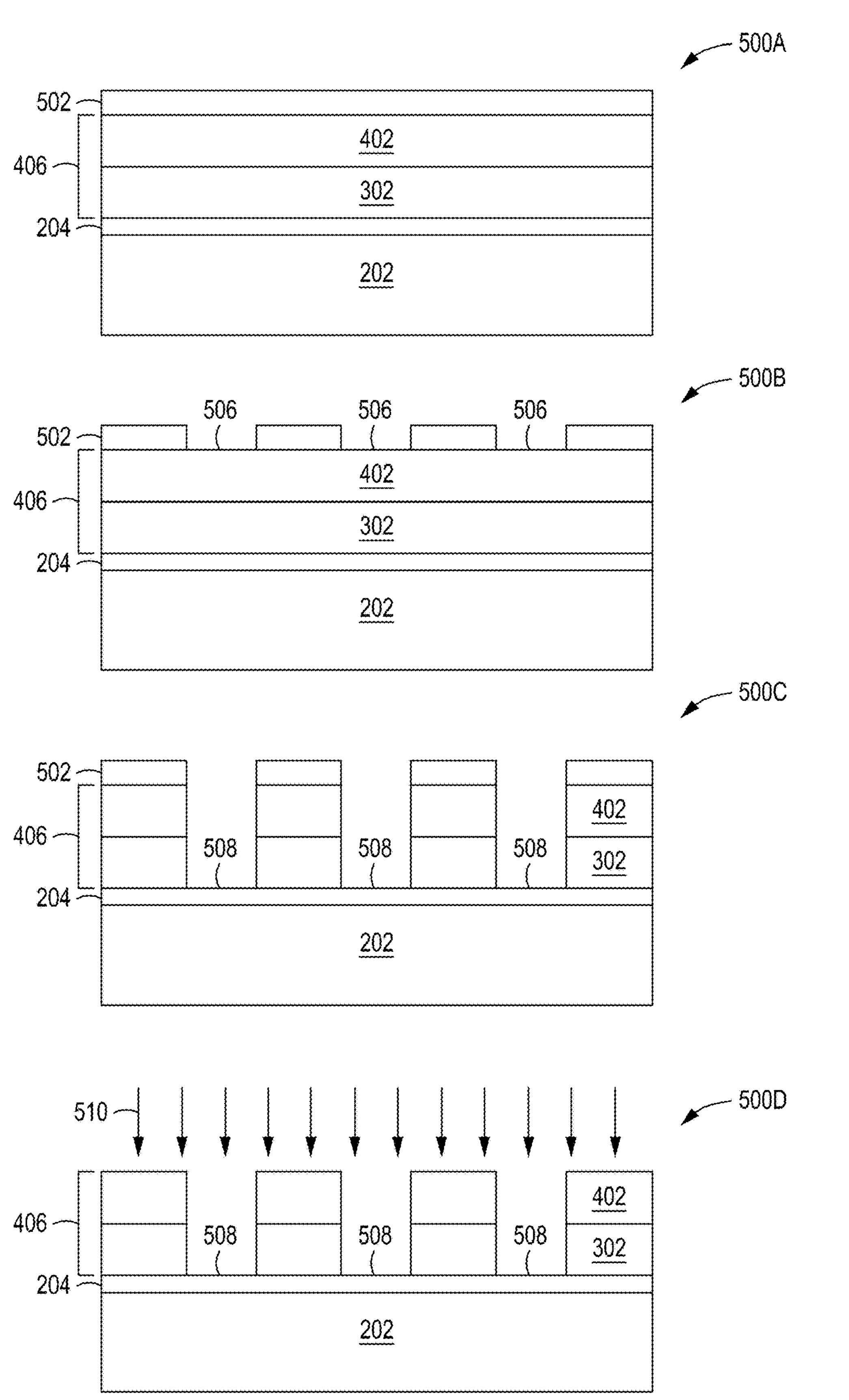
FIG. 5 depicts a cross-sectional view of a patterning of an implant hard mask and an implant process on a substrate in accordance with some embodiments of the present principles.
Figure 6:
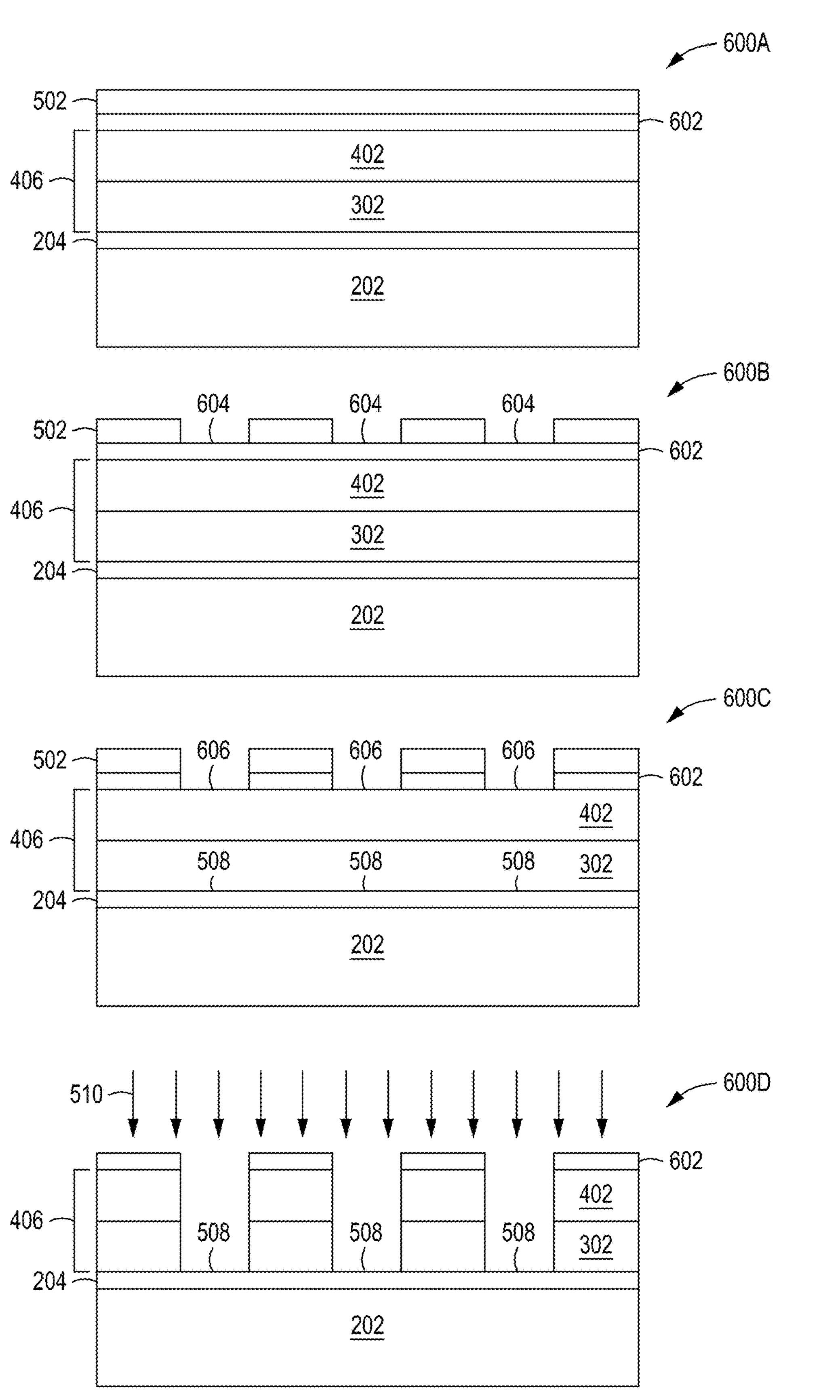
FIG. 6 depicts a cross-sectional view of a patterning of an implant hard mask using an etch stop layer and an implant process on a substrate in accordance with some embodiments of the present principles.

In optional block 108, in some embodiments, an etch stop layer 602 may be optionally deposited on the second layer 402 of the implant hardmask 406 as depicted in a view 600A of FIG. 6. The etch stop layer 602 may be composed of a silicon dioxide, silicon oxynitride, or dielectric antireflective coating (DARC) material when the second layer 402 is composed of a-C material. The subsequently applied photoresist layer may be composed of a carbon-based material and patterning processes that would pattern the photoresist layer could also etch into the underlying second layer if composed of a-C material. The etch stop layer 602 prevents the second layer 402 from being etched during the patterning processes when the second layer 402 is a-C. The etch stop layer 602 is not needed if the second layer is oxide material as patterning of the photoresist will not result in loss of the underlying oxide. In block 110, the photoresist layer 502 is deposited on the second layer 402 as depicted in a view 500A of FIG. 5 or deposited on the etch stop layer 602 as depicted in the view 600A of FIG. 6. In some embodiments, the photoresist layer 502 may be composed of a carbon-based material and the like.

In block 112, the photoresist layer 502 is patterned with a lithography process as depicted in a view 500B of FIG. 5 and in a view 600B of FIG. 6. In the view 500B of FIG. 5, the patterning exposes portions 506 of the underlying second layer 402. In the view 600B of FIG. 6, the patterning exposes portions 604 of the underlying etch stop layer 602. In optional block 114, the etch stop layer 602, if present, may be etched to expose portions 606 of the underlying second layer 402 of the hard mask 406 as depicted in a view 600B of FIG. 6. In block 116, the second layer 402 and the first layer 302 of the implant hard mask 406 are etched to expose portions 508 of the screen layer 204 as depicted in a view 500D of FIG. 5 and a view 600D of FIG. 6. In some embodiments, a plasma-based dry etch process may be used. The first layer 302 and the second layer 402 of the implant hard mask 406 are composed of different materials in each layer of the implant hard mask 406. The etch process uses different chemistries and process parameters to etch each layer of the implant hard mask 406 in a single etch recipe. A first chemistry and first process parameters are used to etch the second layer 402 of the implant hard mask 406 and then switched to a second chemistry and second process parameters to etch the first layer 302 of the implant hard mask 406 to expose portions 508 of the screen layer 204. In general, the photoresist layer 502 is removed during subsequent etching processes. In some embodiments with the etch stop layer 602, the etch stop layer 602 may remain during subsequent implant processing. The process parameters may include, but are not limited to, process temperatures, pressures, and/or duration and the like.

In block 118, a hot, high-energy implant process 510 is performed on the substrate 202 as depicted in the view 500D of FIG. 5 and in the view 600D of FIG. 6. The hot, high-energy implant process 510 may be performed at a temperature of approximately 500 degrees Celsius or higher and with ion energies of approximately 500 KeV or more. The combination of materials in the present implant hard mask allows for a thinner implant hard mask with the same protection capabilities as a traditional, thicker oxide hard mask layer but with substantial advantages. The thinner implant hard mask allows for better vertical etch profiles, the combination of materials allows for higher selectivity during etching to prevent screen layer damage, and easier wet etch removal of the thinner oxide layer.

In some embodiments as depicted in FIG. 5, the screen layer 204 may comprise an oxide material, the first layer 302 of the implant hard mask 406 may comprise an a-C material, and the second layer 402 of the implant hard mask 406 may comprise an oxide material. The a-C material of the first layer 302 may be deposited using a PECVD process to provide a thicker, high-quality a-C layer with high particle performance. The gas chemistry used in the process may be, but is not limited to, $C_xH_y$ (e.g., $C_3H_6$, $C_2H_2$, etc.) and the like. The photoresist layer 502 may be a carbon-based material that is deposited on the second layer 402. Because the photoresist layer 502 is deposited on the oxide layer of the second layer 402, no etch stop layer is needed during the patterning of the photoresist layer 502. The oxide material of the second layer 402 effectively acts as an etch stop layer for the photoresist patterning process. When etching the first layer 302 of the implant hard mask 406, the oxide material of the screen layer 204 acts as an etch stop layer with an a-C to oxide etch selectivity of 30:1, ensuring preservation of the oxide of the screen layer 204 which protects the SiC of the substrate during implantation. The process is compact and cost efficient.

In some embodiments as depicted in FIG. 6, the screen layer 204 may comprise an a-C material, the first layer 302 of the implant hard mask 406 may comprise an oxide material, and the second layer 402 of the implant hard mask 406 may comprise an a-C material. The a-C material of the second layer 402 may be deposited using a PECVD process to provide a thicker, high-quality a-C layer with high particle performance. The gas chemistry used in the process may be, but is not limited to, $C_xH_y$ (e.g., $C_3H_6$, $C_2H_2$, etc.) and the like. The photoresist layer 502 may be carbon-based material that is deposited on the etch stop layer 602. The added process of depositing an etch stop layer 602 and subsequent added process of etching through the etch stop layer 602 makes the process flow of FIG. 6 more complex than the process flow of FIG. 5. When etching the first layer 302 of the implant hard mask 406, the a-C material of the screen layer 204 acts as an etch stop layer with an oxide to a-C etch selectivity of 15:1. While the selectivity ensures substantial preservation of the screen layer 204 over traditional processes (nitride screen layer with less than 8:1 selectivity of oxide over nitride), the process flow of FIG. 5 provides better protection of the screen layer 204 during etching of the implant hard mask 406.

Figure 8:
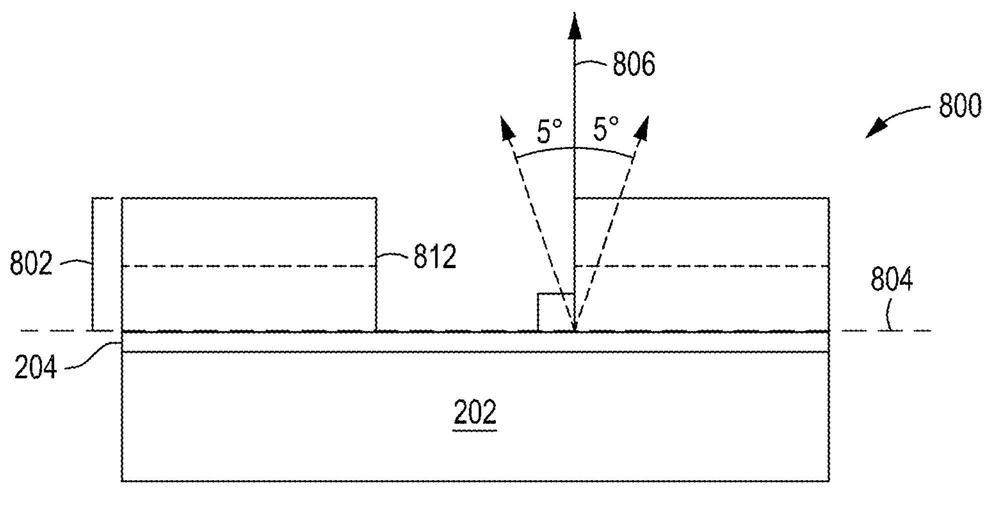
FIG. 8 is a cross-sectional view of vertical etch profiles on an implant hard mask on a substrate in accordance with some embodiments of the present principles.

An additional benefit of the present method is the ability to achieve vertical etch profiles in an implant hard mask 802 of FIG. 8. In some embodiments, sidewalls 812 of the hard mask etch process can obtain approximately +/−5 degrees of vertical 806 relative to a horizontal surface 804 of the substrate 202 as depicted in a view 800 of FIG. 8. In traditional processes, the thickness of the oxide material of the hard mask makes vertical profiles difficult during etching. The present methods reduce the overall thickness of the oxide material substantially while maintaining high-energy ion blocking capabilities of the implant hard mask by incorporating a-C material. The combination of materials also increases the vertical etch profile capabilities over traditional hard masks.

Figure 7:
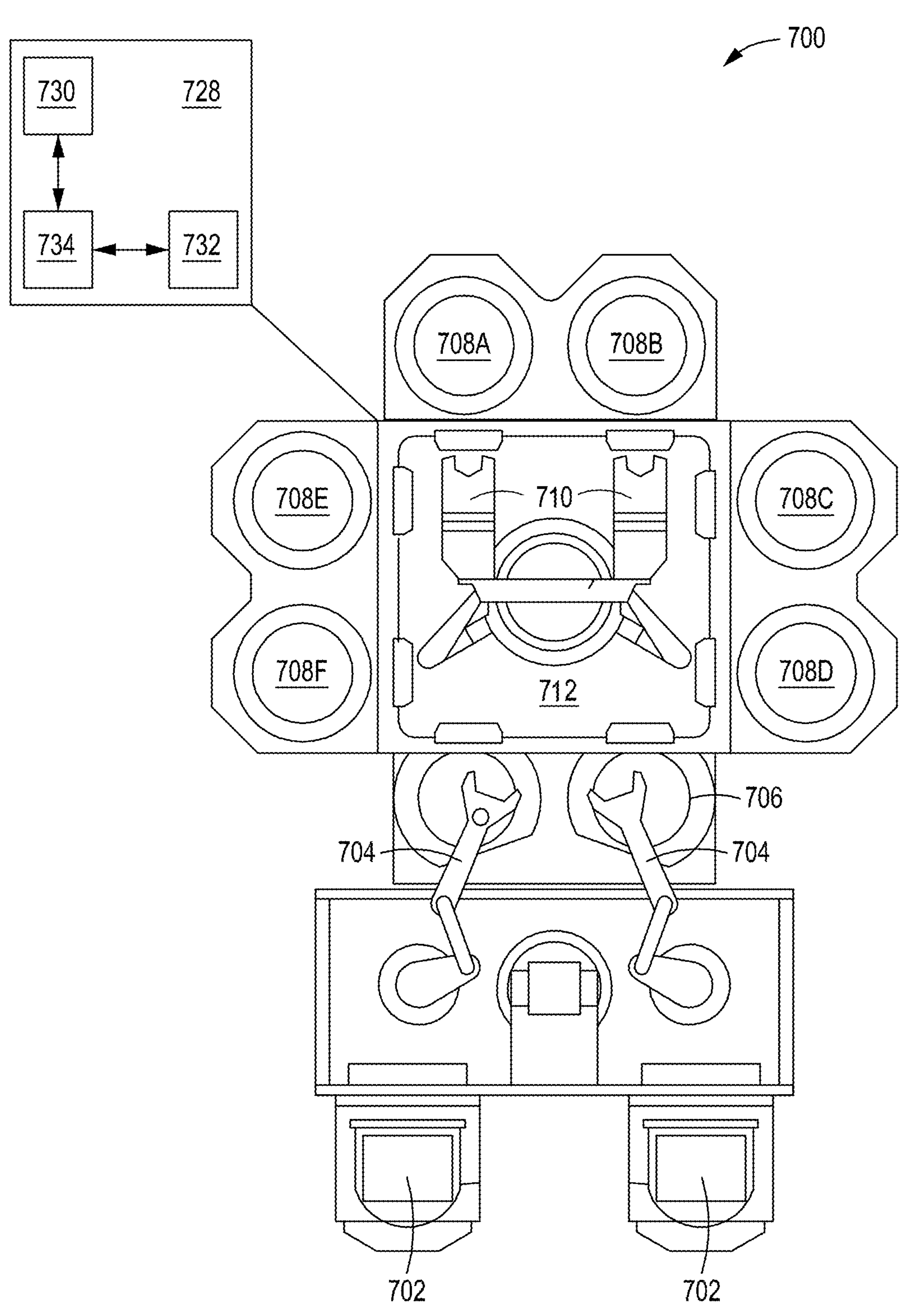
FIG. 7 is a top-down view of an integrated tool in accordance with some embodiments of the present principles.

The methods described herein may be performed in individual process chambers or may be performed in a cluster tool such as, for example, an integrated tool 700 described below with respect to FIG. 7. The advantage of using an integrated tool 700 is that there is no vacuum break and no substantial process lag between depositions. In some embodiments, the integrated tool 700 includes a pair of FOUPs (front opening unified pods) 702 that supply substrates that are accepted by robotic arms 704 and positioned into vacuum holding areas 706 before being relocated into one of the process chambers 708A, 708B, 708C, 708D, 708E, or 708F. A second robotic arm 710 located in a vacuum transfer chamber 712 may be used to move the substrates from the vacuum holding area 706 to the process chambers 708A, 708B, 708C, 708D, 708E, and 708F and back. The process chambers 708A, 708B, 708C, 708D, 708E, and 708F may include one or more chambers for depositing, annealing, curing, and/or etching a substrate. In some embodiments, one or more of the process chambers 708A, 708B, 708C, 708D, 708E, and 708F may include CVD chambers and/or PECVD chambers to deposit a-C and/or oxides and the like to process substrates according to the methods described herein. The methods described herein may also be performed in one or more chambers separated from the integrated tool 700 and then further processed in the integrated tool 700.

The system controller 728 controls the operation of the tool 700 using a direct control of the process chambers 708A, 708B, 708C, 708D, 708E, and 708F or alternatively, by controlling the computers (or controllers) associated with the process chambers 708A, 708B, 708C, 708D, 708E, and 708F and the integrated tool 700. In operation, the system controller 728 enables data collection and feedback from the respective chambers and systems to optimize performance of the integrated tool 700. The system controller 728 generally includes a Central Processing Unit (CPU) 730, a memory 734, and a support circuit 732. The CPU 730 may be any form of a general-purpose computer processor that can be used in an industrial setting. The support circuit 732 is conventionally coupled to the CPU 730 and may comprise a cache, clock circuits, input/output subsystems, power supplies, and the like. Software routines, such as a method as described above may be stored in the memory 734 and, when executed by the CPU 730, transform the CPU 730 into a specific purpose computer (system controller 728). The software routines may also be stored and/or executed by a second controller (not shown) that is located remotely from the integrated tool 700.

The memory 734 is in the form of computer-readable storage media that contains instructions, when executed by the CPU 730, to facilitate the operation of the semiconductor processes and equipment. The instructions in the memory 734 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method for forming an implant hard mask on a substrate, comprising:

depositing a first layer of the implant hard mask on a screen layer on the substrate; and depositing a second layer of the implant hard mask on the first layer of the implant hard mask, wherein the substrate is silicon carbide (SiC), the screen layer is an a-C layer with a first thickness of approximately 20 nm to approximately 100 nm, the first layer of the implant hard mask is an oxide layer with a second thickness of approximately 100 nm to approximately 3000 nm, and the second layer of the implant hard mask is an a-C layer with a third thickness of approximately 100 nm to approximately 3000 nm.

2. The method of claim 1, wherein the second layer is deposited using a plasma-enhanced chemical vapor deposition (PECVD) process.

3. The method of claim 1, further comprising:

depositing an etch stop layer on the second layer of the implant hard mask; and depositing a photoresist layer on the etch stop layer.

4. The method of claim 3, wherein the etch stop layer is a silicon dioxide layer, silicon oxynitride layer, or a dielectric anti-reflective coating (DARC) layer.

5. The method of claim 3, further comprising:

patterning the photoresist layer to expose portions of the etch stop layer;

etching the etch stop layer to expose portions of the second layer of the implant hard mask; and etching the second layer of the implant hard mask and then the first layer of the implant hard mask using a hard mask etch process to expose portions of the screen layer.

6. The method of claim 5, wherein the implant hard mask withstands processing temperatures of greater than approximately 500 degrees Celsius.

7. The method of claim 5, wherein the implant hard mask protects the substrate from damage during hot implanting processes performed with an energy level of approximately 500 KeV or greater.

8. The method of claim 5, wherein the hard mask etch process uses a first chemistry during etching of the second layer of the implant hard mask and a second chemistry different from the first chemistry during etching of the first layer of the implant hard mask.

9. A method for forming an implant hard mask on a substrate, comprising:

depositing a first layer of the implant hard mask on a screen layer on the substrate; and depositing a second layer of the implant hard mask on the first layer of the implant hard mask, wherein the substrate is silicon carbide (SiC), the screen layer is an oxide layer with a first thickness of approximately 20 nm to approximately 100 nm, the first layer of the implant hard mask is an a-C layer with a second thickness of approximately 100 nm to approximately 3000 nm, and the second layer of the implant hard mask is an oxide layer with a third thickness of approximately 100 nm to approximately 3000 nm.

10. The method of claim 9, wherein the first layer is deposited using a plasma-enhanced chemical vapor deposition (PECVD) process.

11. The method of claim 9, further comprising:

depositing a photoresist layer on the second layer of the implant hard mask.

12. The method of claim 11, further comprising:

patterning the photoresist layer to expose portions of the second layer of the implant hard mask; and etching the second layer of the implant hard mask and then the first layer of the implant hard mask using a hard mask etch process to expose portions of the screen layer.

13. The method of claim 12, wherein the hard mask etch process uses a first chemistry during etching of the second layer of the implant hard mask and a second chemistry different from the first chemistry during etching of the first layer of the implant hard mask.

14. The method of claim 12, wherein the implant hard mask withstands processing temperatures of greater than approximately 500 degrees Celsius.

15. The method of claim 12, wherein the implant hard mask protects the substrate from damage during hot implanting processes performed with an energy level of approximately 500 KeV or greater.

16. A method for forming an implant hard mask on a substrate, comprising:

depositing a screen layer on the substrate, wherein the screen layer is an oxide layer with a first thickness of approximately 20 nm to approximately 100 nm;

depositing a first layer of the implant hard mask on the screen layer, wherein the first layer is an amorphous carbon (a-C) layer with a second thickness of approximately 100 nm to approximately 3000 nm;

depositing a second layer of the implant hard mask on the first layer of the implant hard mask, wherein the second layer of the implant hard mask is an oxide layer with a third thickness of approximately 100 nm to approximately 3000 nm;

depositing a photoresist layer on the second layer of the implant hard mask;

patterning the photoresist layer to expose portions of the second layer of the implant hard mask; and etching the second layer of the implant hard mask and then the first layer of the implant hard mask using a hard mask etch process to expose portions of the screen layer, wherein a vertical etch profile of the hard mask etch process has sidewalls within +/−5 degrees of vertical relative to a horizontal surface of the substrate.

17. The method of claim 16, wherein the hard mask etch process uses a first chemistry during etching of the second layer of the implant hard mask and a second chemistry different from the first chemistry during etching of the first layer of the implant hard mask.

18. A non-transitory, computer readable medium having instructions stored thereon that, when executed, cause a method for forming an implant hard mask on a silicon carbide (SiC) substrate to be performed, the method comprising:

depositing a first layer of the implant hard mask on a screen layer on the SiC substrate, wherein the first layer is an amorphous carbon (a-C) layer with a second thickness of approximately 100 nm to approximately 3000 nm;

depositing a second layer of the implant hard mask on the first layer of the implant hard mask, wherein the second layer of the implant hard mask is an oxide layer with a third thickness of approximately 100 nm to approximately 3000 nm;

depositing a photoresist layer on the second layer of the implant hard mask;

patterning the photoresist layer to expose portions of the second layer of the implant hard mask; and etching the second layer of the implant hard mask and then the first layer of the implant hard mask using a hard mask etch process to expose portions of the screen layer, wherein a vertical etch profile of the hard mask etch process has sidewalls within +/−5 degrees of vertical relative to a horizontal surface of the SiC substrate.

19. The non-transitory, computer readable medium of claim 18, the method further comprising:

using a first chemistry during etching of the second layer of the implant hard mask and a second chemistry different from the first chemistry during etching of the first layer of the implant hard mask.

* * * * *